United States Patent [19]

Meza et al.

[11] Patent Number: 4,532,481

[45] Date of Patent: Jul. 30, 1985

[54] HIGH VOLTAGE CURRENT MIRROR

[75] Inventors: Peter J. Meza, Melbourne Beach, Fla.; Alex de la Plaza, Bergamo, Italy

[73] Assignee: Harris Corporation, Melbourne, Fla.

[21] Appl. No.: 504,312

[22] Filed: Jun. 14, 1983

[51] Int. Cl.³ .............................................. H03F 3/04
[52] U.S. Cl. .................................................. 330/288
[58] Field of Search .................. 330/288; 323/315, 316

[56] References Cited

U.S. PATENT DOCUMENTS

| Re. 29,910 | 2/1979 | Ahmed | 330/288 |
| 4,117,417 | 9/1978 | Ahmed | 330/288 |
| 4,119,924 | 10/1978 | Ahmed | 330/288 |
| 4,230,999 | 10/1980 | Ahmed | 330/288 |
| 4,450,414 | 5/1984 | Patterson | 330/288 |

Primary Examiner—James B. Mullins
Assistant Examiner—G. Wan
Attorney, Agent, or Firm—Barnes & Thornburg

[57] ABSTRACT

A high voltage current mirror having a transdiode connection between the input and output terminals and the common base connection of the current mirror input and output transistors to maintain the voltage at the output transistor's collector substantially equal to the voltage at the input transistor's collector while providing current to the input and output transistor bases as a function of the input current.

9 Claims, 3 Drawing Figures

HIGH VOLTAGE CURRENT MIRROR

BACKGROUND OF THE INVENTION

The present invention relates generally to current mirrors and more specifically to an improved high voltage current mirror.

Current mirrors generally include an input path including an input transistor having a transdiode connection between its collector and base and an output transistor whose base is in common with the base of the input transistor and whose emitter is common with emitter of the input transistor and connected to a reference voltage. The output current is taken from the output transistor's collector. The operation of the current mirror is to control the output current to match the input current. A typical example is illustrated in FIG. 1 wherein the input transistor is Q1 receiving the input current $I_i$ from the input terminal to the collector and transdiode connection and an output transistor Q2 having output collector current $I_O$ connected to the output terminal to which is also connected to a load $Z_L$ which is connected to a voltage V. The collector to emitter voltage $V_{CE}$ of transistor Q1 is typically 0.7 volts. The collector to emitter voltage $V_{CE}$ of output transistor Q2 is equal to $V - I_O Z_L$. For small voltage differences between V and $V_{REF}$, the current mirror operates to maintain the input and outputs currents equal. When the voltage difference becomes substantial, the output current $I_O$ becomes larger due to Early voltage effects and therefore the current out does not equal the current in and the $V_{CE}$ of Q2 becomes larger compared to $V_{CE}$ of Q1.

Thus there exists a need for a current mirror which is capable of operating at high voltage differentials.

SUMMARY OF THE INVENTION

An object of the present invention is to provide a current mirror which is capable of operating at high voltage differentials.

Another object of the present invention is to provide a current mirror which is capable of operating at high voltage differentials without the introduction of any new errors into the gain expression.

These and other objects of the inventions are obtained by providing a transdiode connection between the input and output terminals and the common base connection of the current mirror input and output transistors to maintain the voltage at the output transistor's collector substantially equal to the voltage at the input transistor's collector while providing current to the input and output transistor bases as a function of the input current. This transdiode connection includes a transistor having its emitter connected to the input terminal, its base connected to the collector of the output transistor and its collector connected to the common bases of the input and output transistors. A diode equivalent to the base emitter diode of the transdiode transistor is connected between the transdiode transistor's emitter and the input transistor collector. The diode is preferably a transistor having its emitter connected to the emitter of the transdiode transistor and its base and collector connected to the collector of the input transistor. The transdiode transistor and the diode transistor are of opposite conductivity types to the input and output transistors.

Other objects, advantages, and novel features of the present invention will become evident upon review of the detailed description of the preferred embodiments in conjunction with the accompanying drawings.

DETAILED DESCRIPTION OF THE INVENTION

Figure 1:
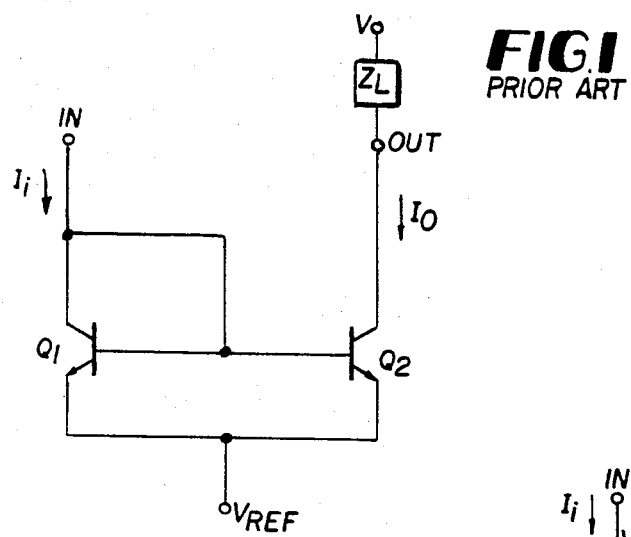
FIG. 1 is a schematic of a prior art current mirror.
Figure 2:
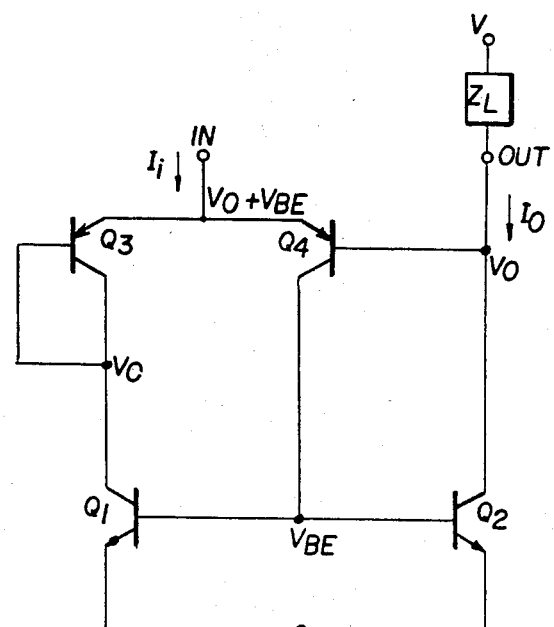
FIG. 2 is a schematic of a current mirror incorporating the principles of the present invention.

A current mirror, illustrated in FIG. 2, includes an input transistor Q1 and an output transistor Q2 having their bases connected together and their emitters connected to a common reference voltage $V_{REF}$. The collector of the output transistor Q2 is connected to an output terminal OUT to which is connected a load $Z_L$ which in turn is connected to a voltage V. Connected between the input terminal IN and the collector terminal Q1 is a diode illustrated as a transistor Q3 having its emitter connected to the input terminal IN and its base and collector connected to the collector of the input transistor Q1. The transdiode transistor Q4 has its emitter connector to terminal IN, its base connected to the collector of the output transistor Q2 and its collector connected to the bases of the input and output transistors Q1 and Q2 respectively. The emitter to collector path of transistor Q4 is the transdiode connection for the input transistor Q1 and the base connection of the transdiode transistor Q4 to the collector of transistor Q2 operates to maintain the voltage at the output transistor's $Q_2$ collector at the collector voltage of the input transistor Q1.

The object of the present invention is to maintain the voltage $V_O$ at the output terminal which is the collector of the output transistor Q2 equal to the voltage at the collector of the input transistor also illustrated as $V_O$. By maintaining these voltages equal, the input current $I_i$ will equal the current $I_O$ irrespective of the voltage difference $V - V_{REF}$. For these conditions, the voltage at the input terminal is the output voltage $V_O$ plus a base to emitter voltage drop $V_{BE}$. The resulting voltage at the bases of the input and output transistors Q1 and Q2 is $V_{BE}$. The transistor Q3 being connected as a diode and having the same geometry and conductivity type as the transdiode Q4 provides a single $V_{BE}$ between the input terminal IN and the collector of the input transistor Q1.

Figure 3:
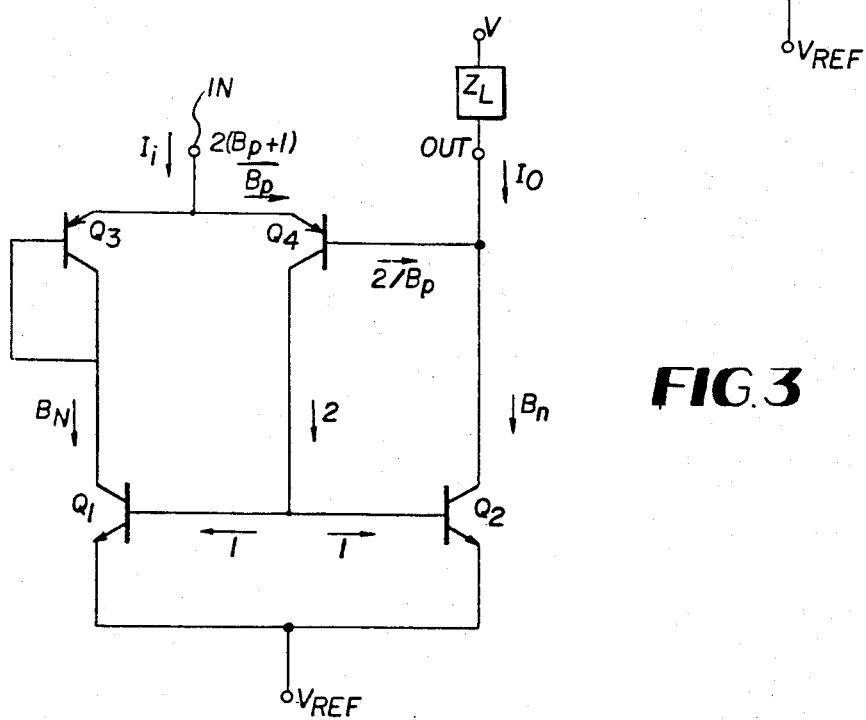
FIG. 3 is a schematic of the current mirror FIG. 1 illustrating current values.

A current analysis is illustrated in FIG. 3 begins with one unit of current being applied to the bases of the input and output transistors Q1 and Q2. Thus, the collector current of transdiode Q4 has a two unit value. The base current of the transdiode Q4 has a value of $2/B_p$ which is the gain of the transdiode transistor Q4 and the emitter of the transdiode Q4 has a current of $2(B_p+1)/B_p$. The collector currents of the input and output transistors Q1 and Q2 is BN. The input current can thus be expressed as $I_i = B_N + 2[(B_p+1)/B_p]$ and the output current $I_O$ maybe expressed as $I_O = B_N - 2(B_p)$. A typical worst case example, $B_N$ is approximately 80 and $B_p$ is 30. Thus, $I_i$ is approximately 82 and $I_O$ approximately 80. Thus, the gain of the loop $I_O$ divided by $I_i$ equals 0.97.

Assume an output voltage of $V_O$ at the collector Q2, which is the voltage sensed by the base of Q4. Since Q4 has sufficient current flow, it is on and its emitter will follow its base until the emitter is at a voltage of $V_O+V_{BE}$. The voltage $V_O+V_{BE}$ is lowered by the $V_{BE}$ of Q3 applied to the collector of the input transistor Q1. Thus, in the steady state condition, the collector to emitter voltage of the input transistor Q1 is equal to the collector to emitter voltage of the output transistor Q2 since both their collectors are maintained at $V_O$ and their emitters are connected to common reference voltage $V_{REF}$. Thus, the circuit is capable of maintaining the collector voltages equal irrespective of the voltage V of the load. Early voltages effects are equal, and thus the input current $I_i$ is equal to the output current $I_O$.

There are two design restraints which must be placed on the present current mirror. More specifically, the compliance voltage for the input terminal cannot exceed the output value of the load voltage V minus the output voltage $V_O$ or the current mirror will cease to function. Another design criteria is that the current loop formed by the base collector paths of Q2 and Q4 may oscillate depending upon the selection of the transistors Q2 and Q4 the input current $I_i$, the load resistance $Z_L$ and the load voltage V. Thus, care must be taken to keep the gain of this loop sufficiently low to avoid oscillation.

Its evident from the detailed description of the present invention, that the objects of the invention are obtained in that an improved current mirror is provided for high voltage applications. Although the invention has been described and illustated detailed, it is to be clearly understood that the same is by way of illustration and example only, and it is not to be taken by way of limitation. Although the load transistors are shown as NPN transistors and the transdiode and diode transistors are shown as PNP transistors, this relationship may be reversed and the current mirror may be formed using the PNP load transistors and NPN transdiode and diode transistors. The spirit and scope of the present invention are to be limited only by the terms of the appended claims.

What is claimed is:

1. A current mirror comprising:
   an input transistor and an output transistor each having a base, collector and emitter;
   said emitters of said inut and output transistors being connected to a reference terminal;
   said bases of said input and output transistors being connected together;
   an input terminal connected to said collector of said input transistor;
   an output terminal connected to said collector of said output transistor;
   transdiode means connected between said input and output terminals and said input and output transistors bases for maintaining the voltage at said output transistor's collector substantially equal to the voltage at said input transistor's collector and providing current to said input and output transistor bases as a function of the input current.

2. A current mirror according to claim 1 wherein said transdiode means includes a transdiode transistor having an emitter connected to said input terminal, a base connected to said output transistor's collector and a collector connected to said input and output transistor's bases.

3. A current mirror according to claim 2 wherein said transdiode transistor is of a conductivity type opposite said input and output transistors.

4. A current mirror according to claim 2 including a diode connected between said transdiode transistor's emitter and said input transistor's collector, said diode is equivalent to the base-emitter diode of said transdiode transistor.

5. A current mirror according to claim 4 wherein said diode is a diode transistor of the same conductivity type and geometry as said transdiode transistor, having its emitter connected to said input terminal and its base and collector connected to said input transistor's collector.

6. A current mirror according to claim 5 wherein said transdiode and diode transistors are of a conductivity type opposite said input and output transistors.

7. A current mirror comprising:
   a input terminal;
   an output terminal;
   a reference terminal;
   an input transistor having an emitter connected to said reference terminal, a collector and a base;
   an output transistor having an emitter connected to said reference terminal, a collector connected to said output terminal and a base connected to said input transistor's base;
   a transdiode transistor having an emitter connected to said input terminal, a base connected to said output transistor's collector and a collector connected to said input and output transistor's bases; and
   a diode connected between said transdiodes transistor's emitter and said input transistor's collector.

8. A current mirror according to claim 7 wherein said diode is a diode transistor of the same conductivity type and geometry as said transdiode transistor, having its emitter connected to said input terminal and its base and collector connected to said input transistor's collector.

9. A current mirror according to claim 8 wherein said transdiode and diode transistors are of a conductivity type opposite said input and output transistors.

* * * * *